United States Patent
Bhatti et al.

(10) Patent No.: US 7,269,011 B2
(45) Date of Patent: Sep. 11, 2007

(54) IMPINGEMENT COOLED HEAT SINK WITH UNIFORMLY SPACED CURVED CHANNELS

(75) Inventors: Mohinder Singh Bhatti, Amherst, NY (US); Debashis Ghosh, Amherst, NY (US); Shrikant Mukund Joshi, Williamsville, NY (US)

(73) Assignee: Delphi Technologies, Inc., Troy, MI (US)

( * ) Notice: Subject to any disclaimer, the term of this patent is extended or adjusted under 35 U.S.C. 154(b) by 223 days.

(21) Appl. No.: 11/197,419

(22) Filed: Aug. 4, 2005

(65) Prior Publication Data

US 2007/0030655 A1    Feb. 8, 2007

(51) Int. Cl.
*H05K 7/20* (2006.01)
*F28F 7/00* (2006.01)

(52) U.S. Cl. ............. 361/699; 165/80.4; 165/908
(58) Field of Classification Search ......... 165/80.3, 165/170, 908; 361/699
See application file for complete search history.

(56) References Cited

U.S. PATENT DOCUMENTS

| | | | | |
|---|---|---|---|---|
| 4,411,311 A | * | 10/1983 | Touze | ............ 165/170 |
| 4,450,896 A | * | 5/1984 | Opitz et al. | ............ 165/146 |
| 4,733,293 A | | 3/1988 | Gabuzda | |
| 4,838,041 A | * | 6/1989 | Bellows et al. | ............ 62/51.2 |
| 5,019,880 A | | 5/1991 | Higgins, III | |
| 5,365,400 A | * | 11/1994 | Ashiwake et al. | ............ 361/752 |
| 5,597,034 A | | 1/1997 | Barker, III et al. | |
| 5,841,634 A | * | 11/1998 | Visser | ............ 361/699 |
| 6,015,008 A | | 1/2000 | Kogure et al. | |
| 6,148,907 A | * | 11/2000 | Cheng | ............ 165/121 |
| 6,196,300 B1 | | 3/2001 | Checchetti | |
| 6,219,242 B1 | | 4/2001 | Martinez | |
| 6,552,902 B2 | | 4/2003 | Cho et al. | |
| 6,578,626 B1 | * | 6/2003 | Calaman et al. | ............ 165/80.4 |
| 6,606,833 B2 | * | 8/2003 | Richardson et al. | ............ 52/204.5 |
| 6,659,169 B1 | * | 12/2003 | Lopatinsky et al. | ............ 165/121 |
| 6,719,038 B2 | | 4/2004 | Bird et al. | |
| 6,796,370 B1 | * | 9/2004 | Doll | ............ 165/80.4 |

(Continued)

FOREIGN PATENT DOCUMENTS

EP     1 204 143 A2    5/2002

*Primary Examiner*—Gregory D Thompson
(74) *Attorney, Agent, or Firm*—Patrick M. Griffin

(57) ABSTRACT

A heat sink assembly for removing heat from an electronic device and comprising a base, a lid in spaced relationship with and parallel to the base, and an outer wall spiraling radially outwardly about an inlet axis from an inner exit position to an outer exit position to define a tangential outlet between said exit positions. Each of a plurality of curved fins presents a concave surface and a convex surface and extends from an inner circle with radius concentric with the inlet axis to an outer circle with radius concentric with the inlet axis to define a plurality of curved channels between adjacent fins for directing the flow of cooling fluid radially from the inlet axis. Each of the curved channels is disposed at a constant distance between next adjacent fins for a major length there along from the inner circle with radius toward the outer circle with radius. That substantially constant distance extends from the inner circle with radius to a perpendicular position where the convex surface of that fin is perpendicular to the intersection of the outer circle with radius with the next adjacent fin to the convex surface.

10 Claims, 3 Drawing Sheets

U.S. PATENT DOCUMENTS 6,907,739 B2 * 6/2005 Bell .............................. 62/3.7
7,073,569 B1 * 7/2006 Joshi et al. ............ 165/104.33
7,143,816 B1 * 12/2006 Ghosh et al. .............. 165/80.4

* cited by examiner

IMPINGEMENT COOLED HEAT SINK WITH UNIFORMLY SPACED CURVED CHANNELS

BACKGROUND OF THE INVENTION

1. Field of the Invention

The subject invention relates to a cooling assembly for cooling an electronic device such as a microprocessor or a computer chip.

2. Description of the Prior Art

These electronic devices generate a high concentration of heat, typically a power density in the range of 5 to 35 W/cm$^2$. Accordingly, research activities have focused on developing more efficient cooling assemblies capable of efficiently dissipating the heat generated from such electronic devices, while occupying a minimum of space.

A forced air-cooled assembly typically includes a heat exchanger and a heat sink, and cools the electronic device by natural or forced convection cooling methods. The electronic device is attached to the heat sink and transfers heat thereto. The heat exchanger typically uses air to directly remove the heat from the heat sink. However, air has a relatively low heat capacity. Such forced air-cooled assemblies are suitable for removing heat from relatively low power heat sources with a power density in the range of 5 to 15 W/cm$^2$. However, the increased computing speeds have resulted in a corresponding increase in the power density of the electronic devices in the order of 20 to 35 W/cm$^2$, thus requiring more effective cooling assemblies.

In response to the increased heat produced by the electronic devices, liquid-cooled cooling assemblies, commonly referred to as liquid cooled units ("LCUs") were developed. The LCUs employ a heat sink in conjunction with a high heat capacity cooling fluid, like water or water-glycol solutions, to remove heat from these types of higher power density heat sources. One type of LCU circulates the cooling fluid through the heat sink to remove the heat absorbed from the heat source affixed thereto. The cooling fluid is then transferred to a remote location where the heat is easily dissipated into a flowing air stream with the use of a liquid-to-air heat exchanger and an air-moving device such as a fan or a blower. These types of LCUs are characterized as indirect cooling units since they remove heat form the heat source indirectly by a secondary working fluid. Generally, a single-phase liquid first removes heat from the heat sink and then dissipates it into the air stream flowing through the remotely located liquid-to-air heat exchanger. Such LCUs are satisfactory for a moderate heat flux less than 35 to 45 W/cm$^2$.

The LCUs of the prior art have included an axial inlet for coolant with a diverter to direct the coolant radially outward and into fins or vanes. Examples of such are illustrated in U.S. Pat. No. 4,733,293 to Gabuzda; U.S. Pat. No. 5,597,034 to Barker, III, et al.; U.S. Pat. No. 6,196,300 to Checchetti; U.S. Pat. No. 6,219,242 to Martinez and U.S. Pat. No. 6,719,038 to Bird et al. Each patent discloses a heat sink assembly having radial fins or vanes and used in a LCU. The heat sink assemblies include a base plate with a plurality of fins having smooth sidewalls extending upwardly from the base plate. In operation, the base plate absorbs the heat from the electronic device and transfers the heat to the fins. A cooling fluid flows past the smooth walled fins, drawing the heat from the fins, thereby removing the heat from the heat sink. The flow of cooling fluid is directed parallel to the fins by a central diverter.

The U.S. Pat. No. 5,019,880, issued to Higgins, discloses a heat sink that includes a circular base with a central flow diverter having a conical shape extending upwardly from the base. A plurality of planar fins is disposed radially about the circumference of the flow diverter and extends upwardly from the base to a lid. An inlet is disposed above the lid for directing a flow of cooling fluid axially onto the flow diverter. The flow of cooling fluid then circulates radially outward to the outer periphery of the base through a plurality of flow channels defined between the planar fins.

SUMMARY OF THE INVENTION AND ADVANTAGES

The subject invention provides such a heat sink assembly for removing heat from an electronic device wherein each of said curved channels is disposed at a substantially constant distance between the next adjacent fins for a major length there along as the fins extend from an inner circle toward an outer circle.

In a more specific sense, the constant distance with the next adjacent fin to the concave surface of each fin extends from that inner circle to a perpendicular position where the convex surface of the each fin is perpendicular to the intersection of the outer circle with the next adjacent fin to that convex surface.

Accordingly, the subject invention provides a heat sink assembly that is extremely compact and includes an optimally configured assembly. The constant distance provides uniformly spaced fins to maintain flow velocity. The assembly provides impingement cooling for the electronic chip at the hottest spot. The assembly may also be of a single piece (as by brazing) construction.

BRIEF DESCRIPTION OF THE DRAWINGS

Other advantages of the present invention will be readily appreciated, as the same becomes better understood by reference to the following detailed description when considered in connection with the accompanying drawings wherein.

DETAILED DESCRIPTION OF THE INVENTION

Figure 1:
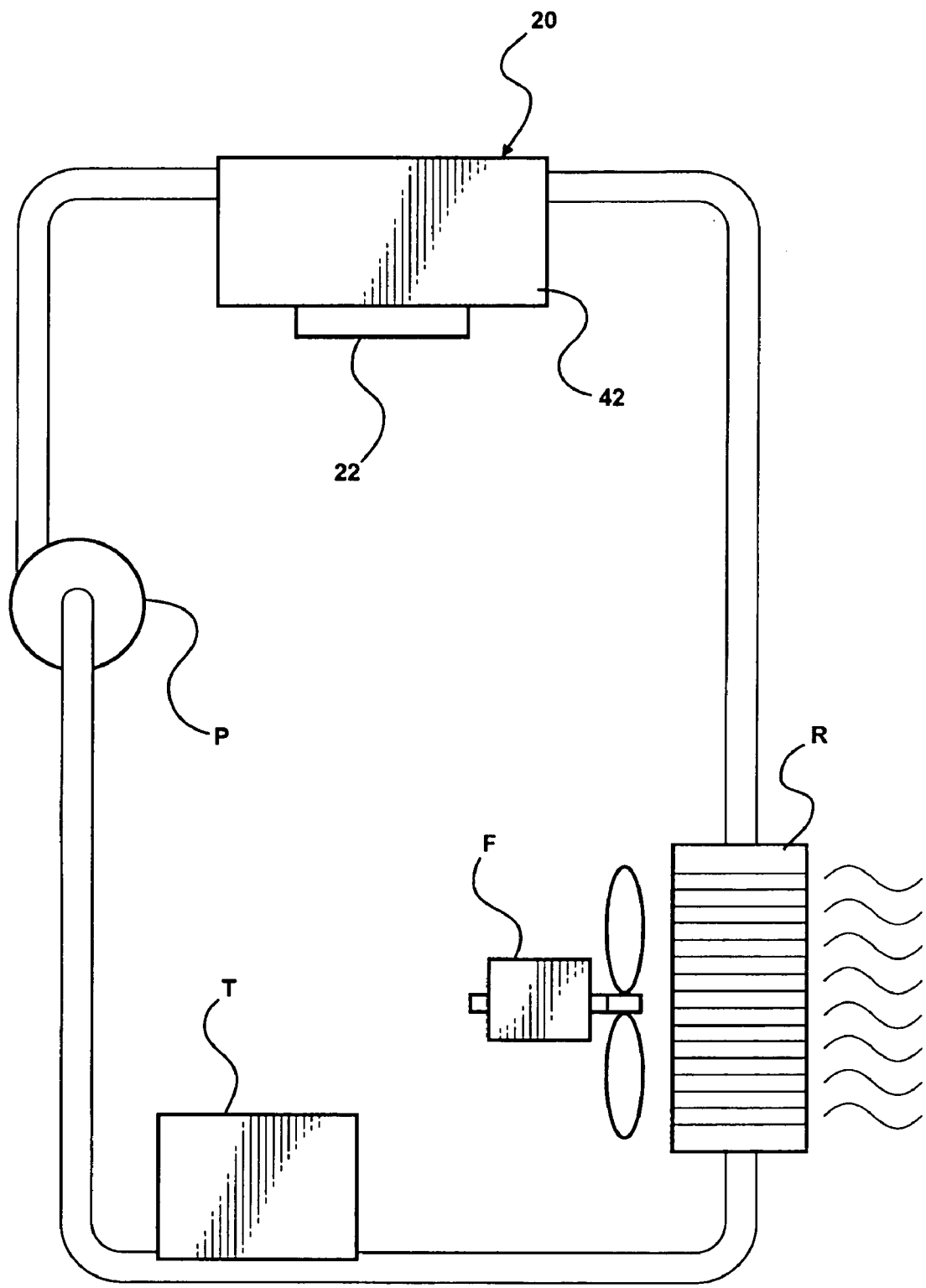
FIG. 1 is a schematic view of a system in which the subject invention finds utility.
Figure 2:
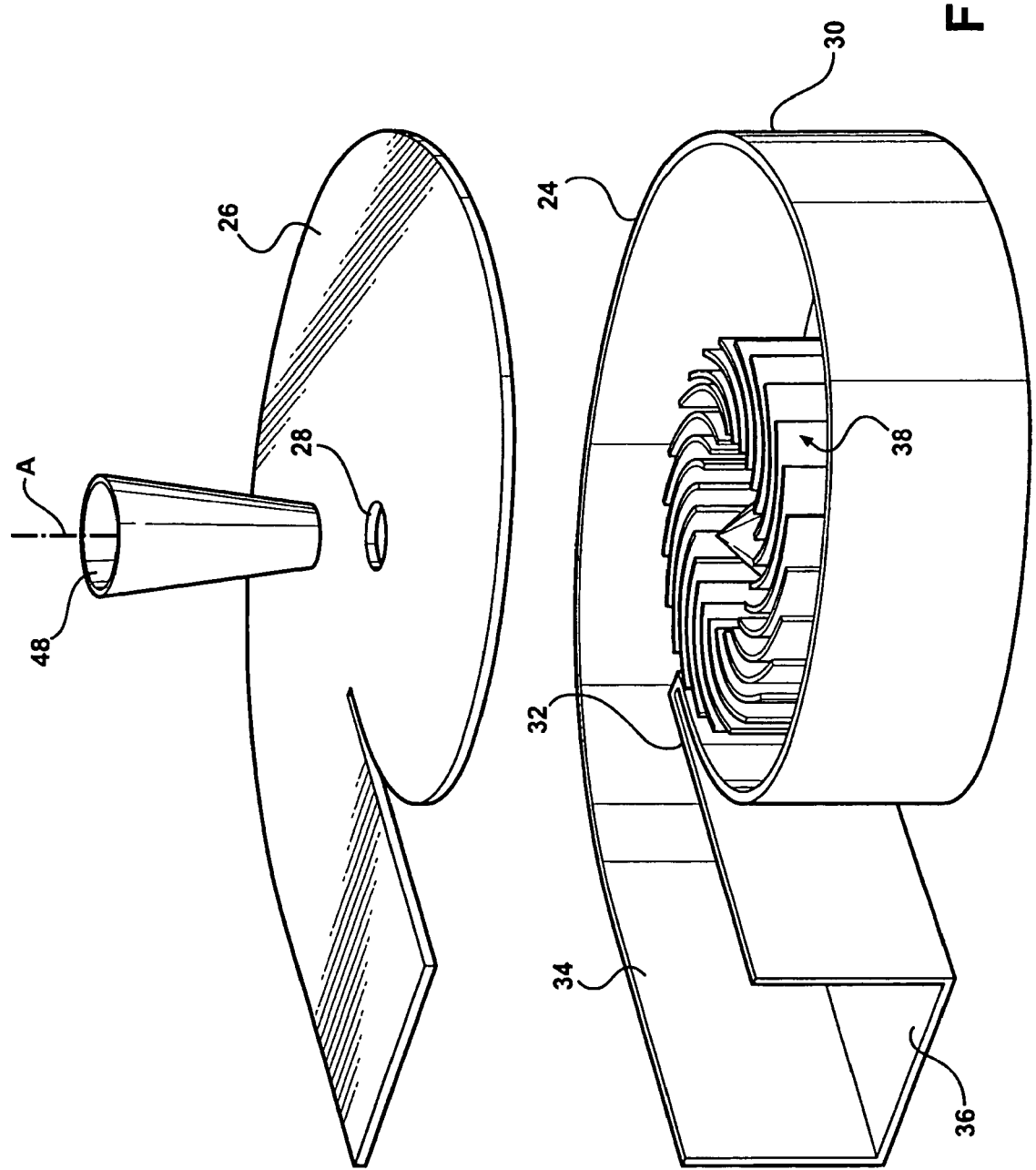
FIG. 2 is an exploded perspective view of the heat sink assembly of the subject invention.

Referring to the Figures, wherein like numerals indicate corresponding parts throughout the several views, FIG. 1 illustrates a system incorporating the heat sink 20 of the subject invention into a liquid cooling system. The heat sink 20 assembly removes heat from an electronic device 22.

A working fluid mover, such as a pump P, creates a flow of cooling fluid, usually a liquid, through a cooling fluid storage tank T, which stores excess cooling fluid. The pump P moves the cooling fluid through a heat extractor assembly to dissipate heat from the cooling fluid. The heat extractor includes a fan F and a radiator R. The radiator R can be of the well known type including tubes with cooling fins between the tubes to exchange heat between the cooling fluid passing through the tubes and air forced through the radiator R by the fan F.

The essence of the heat sink 20 assembly is a housing having a base 24 with a top surface, a lid 26 with a bottom surface in spaced relationship with and parallel to the top surface of the base 24. The lid 26 defines an inlet opening 28 on an inlet axis A, and a nozzle 48 directs the flow of cooling fluid downwardly (as illustrated) along the axis A. An outer wall 30 extends vertically between the top surface of the base 24 and the bottom surface of the lid 26 and spirals radially outwardly about the inlet axis A from an inner exit position 32 to an outer exit position 34 to define a tangential outlet 36 between the exit positions 32, 34, wherein the width of the tangential outlet 36 between the inner exit position 32 and the outer exit position 34 is designated as c in FIG. 4.

A plurality of curved fins 38 extend vertically or transversely between the top surface of the base 24 and the bottom surface of the lid 26. Forging onto the top surface of the base 24 preferably makes the curved fins 38. The components are preferably of a metal and are wired together and placed in a furnace for being brazed together. Each fin 38 presents an outer concave surface and an inner convex surface and each fin 38 extends from an inner circle with radius a concentric with the inlet axis A to an outer circle with radius b concentric with the inlet axis A to define a plurality of curved channels between adjacent fins 38 for directing the flow of cooling fluid radially from the inlet axis A. Each of the curved channels is disposed at and extends along a substantially constant distance d between next adjacent fins 38 on either side thereof for a major length there along from the inner circle with radius a toward the outer circle with radius b, i.e., subject to manufacturing tolerances, the distance d is constant. The constant fin gap d, with or to the next adjacent fin 38 to the concave surface of each fin 38, extends the major length from the inner circle a to a perpendicular position e where the convex surface of the each fin 38 is perpendicular to the intersection of the outer circle b with the next adjacent fin 38 to the convex surface. In other words, the perpendicular position e is at the outward end of each fin on the outer circle b and the fin gap d is received along a line from that fin end perpendicular to the convex surface of the inside and next adjacent fin.

The primary advantage of providing curved fins 38 with substantially constant fin gap d is that the flow mean velocity over the base 24 is maintained as the impinging fluid flows away in a spiral pattern from the point of impingement. This results in higher heat transfer rate over the entire base surface 24. When the fins 38 are straight the impinging fluid flows away from the point of impingement in a radial pattern with ever increasing fin gap d. This results in progressively lower flow mean velocity away from the point of impingement resulting in progressively lower heat transfer rate over the fin base surface 24.

Figure 4:
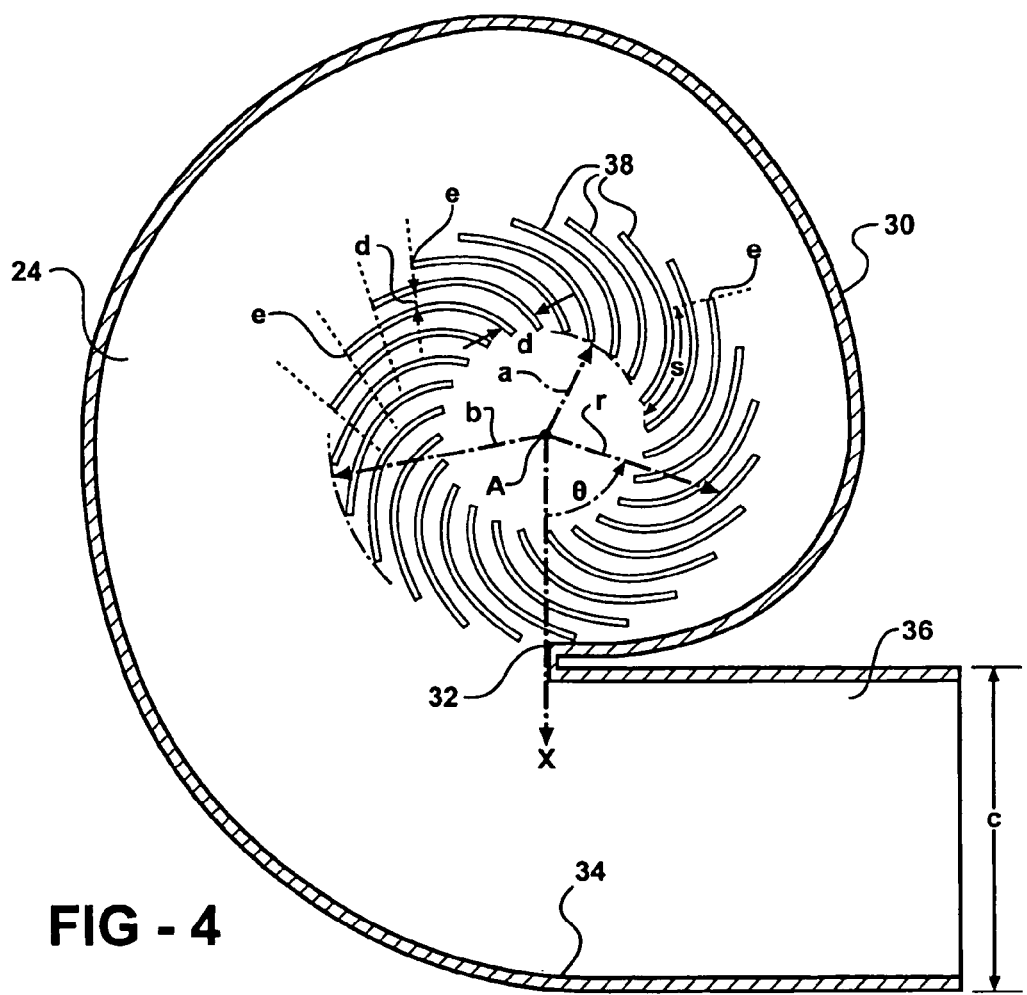
FIG. 4 is a plan view of the heat sink assembly of the subject invention.

A point along each fin 38 is determined by the polar equation $$\theta = \sqrt{\left(\frac{r}{a}\right)^2 - 1} - \sec^{-1}\left(\frac{r}{a}\right)$$

where r is the radial distance from the inlet axis A to the point and θ is the angle and x is a reference or vertical axis extending radially from the inlet axis A, as indicated in FIG. 4.

The arcuate length s of each fin 38, from the inner circle a to the perpendicular position e, is determined by the formula $$s = \frac{a}{2}\left[\left(\frac{b}{a}\right)^2 - 1\right]$$

The distance (fin gap) d between fins 38 is defined as $$d = \frac{2\pi a}{N}$$

where N is the number of fins 38. The larger the value of N, the smaller the fin gap d.

The inner exit position 32 is on the outer circle with radius b and the outer wall 30 spirals radially outwardly about the inlet axis A from the inner exit position 32 on the outer circle with radius b to the outer exit position 34 in accordance with the formula $$\theta = \left[\left(\frac{r}{b}\right)^2 - 1\right]^{1/n}$$

where the exponent n≧2, the preferred value being 2.5 for a compact heat sink 20.

The width C of the tangential outlet 36 between the inner exit position 32 and the outer exit position 34 is given as $$c = b[\sqrt{1+(2\pi)^n} - 1]$$

Figure 3:
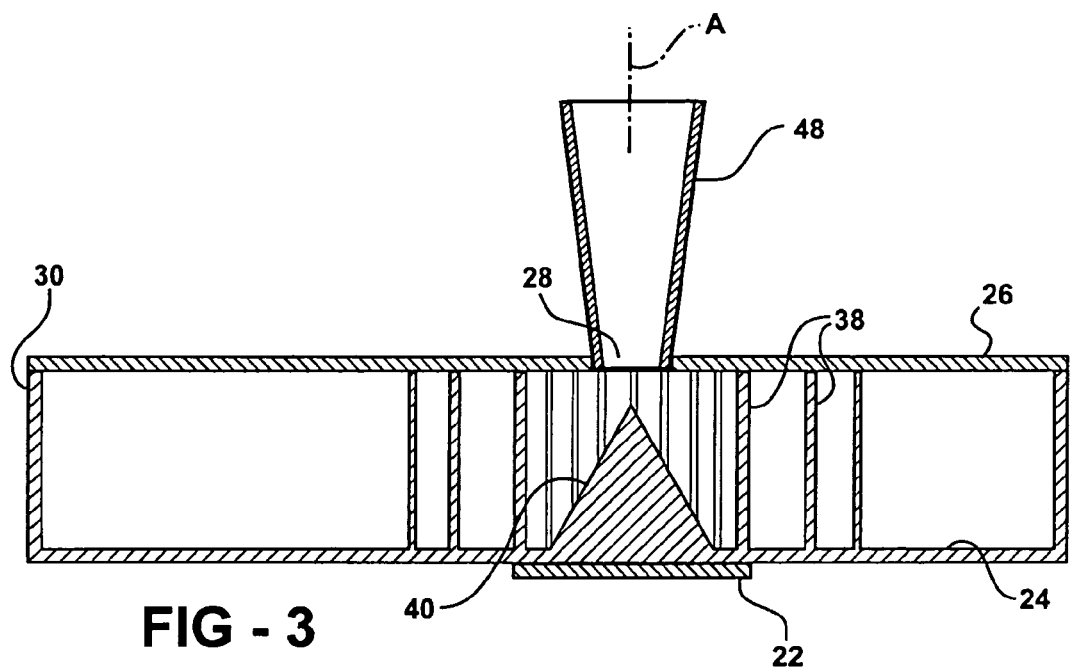
FIG. 3 is a cross sectional perspective view of the heat sink assembly of the subject invention showing the flow diverter in relationship to the nozzle and fins.

As illustrated in FIG. 3, the heat sink 20 assembly also includes a flow diverter 40 extending upwardly about the inlet axis A from the top surface of the base 24 toward the bottom surface of the lid 26 whereby the inlet opening 28 is aligned with the flow diverter 40 for impinging the flow of cooling fluid on the flow diverter 40 to re-direct the flow of fluid radially outwardly and into the channels between the fins 38.

The flow diverter 40 performs three useful functions. First, it absorbs heat from the central high heat flux zone of the electronic device 22 spreading it over larger surface area extending upwardly from the top surface of the base 24 to facilitate heat removal by the impinging fluid. Second, it directs the impinging flow of the fluid into the gaps d between the fins 38. Third, it minimizes erosion of the base 24 by the high velocity jet of the impinging fluid.

Obviously, many modifications and variations of the present invention are possible in light of the above teachings. The invention may be practiced otherwise than as specifically described within the scope of the appended claims, wherein that which is prior art is antecedent to the novelty set forth in the "characterized by" clause. The novelty is meant to be particularly and distinctly recited in the "characterized by" clause whereas the antecedent recitations merely set forth the old and well-known combination in which the invention resides. These antecedent recitations should be interpreted to cover any combination in which the incentive novelty exercises its utility. In addition, the reference numerals in the claims are merely for convenience and are not to be read in any way as limiting.

What is claimed is:

1. A heat sink assembly for removing heat from an electronic device, said assembly comprising:

a base having a top surface, a lid having a bottom surface in spaced relationship with and parallel to said top surface of said base, said lid defining an inlet opening on an inlet axis, an outer wall extending between said top surface of said base and said bottom surface of said lid and spiraling radially outwardly about said inlet axis from an inner exit position to an outer exit position to define a tangential outlet between said exit positions, a plurality of curved fins extending between said top surface of said base and said bottom surface of said lid and each presenting a concave surface and a convex surface extending from an inner circle with radius concentric with said inlet axis to an outer circle with radius concentric with said inlet axis to define a plurality of curved channels between adjacent fins for directing the flow of cooling fluid radially from said inlet axis, and each of said curved channels being disposed at a substantially constant distance between next adjacent fins for a major length there along from said inner circle with radius toward said outer circle with radius.

2. An assembly as set forth in claim 1 wherein said substantially constant distance with the next adjacent fin to said concave surface of each fin extends from said inner circle with radius to a perpendicular position where said convex surface of said each fin is perpendicular to the intersection of said outer circle with radius with the next adjacent fin to said convex surface.

3. An assembly as set forth in claim 1 wherein a point along each fin is determined by the polar equation $$\theta = \sqrt{\left(\frac{r}{a}\right)^2 - 1} - \sec^{-1}\left(\frac{r}{a}\right)$$

where r is the radial from said inlet axis to said point and θ is the angle and x is a reference axis extending radially from said inlet axis.

4. An assembly as set forth in claim 1 wherein the arcuate length s of each fin is determined by the formula $$s = \frac{a}{2}\left[\left(\frac{b}{a}\right)^2 - 1\right].$$

5. An assembly as set forth in claim 1 wherein said distance between fins is $$d = \frac{2\pi a}{N}$$

where N is the number of fins.

6. An assembly as set forth in claim 1 wherein said inner exit position is on said outer circle with radius and said outer wall spirals radially outwardly about said inlet axis from said inner exit position on said outer circle with radius to said outer exit position in accordance with $$\theta = \left[\left(\frac{r}{b}\right)^2 - 1\right]^{1/n}$$

where n is an exponent with a value ≧2, the preferred value being 2 for a compact heat sink.

7. An assembly as set forth in claim 1 wherein the width of said tangential outlet between said inner exit position and said outer exit position is given as $$c = b[\sqrt{1+(2\pi)^n} - 1].$$

8. An assembly as set forth in claim 1 including a flow diverter extending upwardly about said inlet axis from said top surface of said base toward said bottom surface of said lid whereby said inlet opening is aligned with said flow diverter for impinging the flow of cooling fluid on said flow diverter to re-direct the flow of fluid radially outwardly and into said channels between said fins.

9. An assembly as set forth in claim 1 including a fluid pump for circulating a flow of cooling fluid to said inlet opening and a heat exchanger for removing heat from the flow of cooling fluid exiting said tangential outlet.

10. A heat sink assembly for removing heat from an electronic device, said assembly comprising:

a base having a top surface, a lid having a bottom surface in spaced relationship with and parallel to said top surface of said base, said lid defining an inlet opening on an inlet axis, an outer wall extending between said top surface of said base and said bottom surface of said lid and spiraling radially outwardly about said inlet axis from an inner exit position to an outer exit position to define a tangential outlet between said exit positions, a plurality of curved fins extending between said top surface of said base and said bottom surface of said lid and each presenting a concave surface and a convex surface extending from an inner circle with radius concentric with said inlet axis to an outer circle with radius concentric with said inlet axis to define a plurality of curved channels between adjacent fins for directing the flow of cooling fluid radially from said inlet axis, each of said curved channels being disposed at a substantially constant distance is expressed as $$d = \frac{2\pi a}{N}$$

between next adjacent fins for a major length there along from said inner circle with radius toward said outer circle with radius, said substantially constant distance with the next adjacent fin to said concave surface of each fin extending from said inner circle with radius to a perpendicular position where said convex surface of said each fin is perpendicular to the intersection of said outer circle with radius with the next adjacent fin to said convex surface, a point along each curved fin is determined by the polar equation $$\theta = \sqrt{\left(\frac{r}{a}\right)^2 - 1} - \sec^{-1}\left(\frac{r}{a}\right)$$

where r is the radial from said inlet axis to said point and θ is the angle and x is a reference axis extending radially from said inlet axis, the arcuate length S of each fin is determined by the formula $$s = \frac{a}{2}\left[\left(\frac{b}{a}\right)^2 - 1\right]$$

said inner exit position being on said outer circle with radius and said outer wall spirals radially outwardly about said inlet axis from said inner exit position on said outer circle with radius to said outer exit position in accordance with $$\theta = \left[\left(\frac{r}{b}\right)^2 - 1\right]^{1/n}$$

the width of said tangential outlet between said inner exit position and said outer exit position being given as $$c = b[\sqrt{1+(2\pi)^n} - 1].$$

* * * * *